United States Patent
Komine et al.

(10) Patent No.: US 6,872,508 B2
(45) Date of Patent: Mar. 29, 2005

(54) EXPOSURE METHOD AND METHOD OF MANUFACTURING SEMICONDUCTOR DEVICE

(75) Inventors: Nobuhiro Komine, Yokohama (JP); Keita Asanuma, Yokohama (JP); Tatsuhiko Higashiki, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 10/180,004

(22) Filed: Jun. 26, 2002

(65) Prior Publication Data

US 2003/0016341 A1 Jan. 23, 2003

(30) Foreign Application Priority Data

Jun. 27, 2001 (JP) ........................................ 2001-195165

(51) Int. Cl.⁷ ................................................. G03F 9/00
(52) U.S. Cl. ............................ 430/311; 430/5; 355/53; 355/71; 355/67
(58) Field of Search ....................... 430/311, 5; 355/53, 355/71, 67

(56) References Cited

U.S. PATENT DOCUMENTS

| | | | | |
|---|---|---|---|---|
| 5,357,311 A | * | 10/1994 | Shiraishi | ...................... 355/53 |
| 6,636,293 B1 | * | 10/2003 | Shiraishi | ...................... 355/53 |
| 6,654,101 B2 | * | 11/2003 | Suzuki et al. | ................. 355/53 |

FOREIGN PATENT DOCUMENTS

| | | |
|---|---|---|
| JP | 5-326370 | 12/1993 |
| JP | 6-77111 | 3/1994 |
| JP | 2633091 | 4/1997 |
| JP | 2890892 | 2/1999 |
| JP | 3009923 | 12/1999 |
| JP | 3119217 | 10/2000 |
| KR | 1996-6686 | 5/1996 |

* cited by examiner

*Primary Examiner*—John A. McPherson
*Assistant Examiner*—Daborah Chacko-Davis
(74) *Attorney, Agent, or Firm*—Finnegan, Henderson, Farabow, Garrett & Dunner, L.L.P.

(57) ABSTRACT

Disclosed is an exposure method comprising preparing an exposure apparatus including an illumination system and a projection lens, setting, in the exposure apparatus, a photomask having a mask pattern including a plurality of unit circuit patterns arranged like a checkered flag pattern and a plurality of unit auxiliary patterns arranged between the unit circuit patterns, and projecting the mask pattern onto a substrate through the projection lens by irradiating the photomask with light from the illumination system, wherein the unit circuit patterns and the unit auxiliary patterns generate a plurality of diffraction light spots on a pupil plane of the projection lens, and the four diffraction light spots having higher light intensities than the remaining diffraction light spots are distributed on the pupil plane in a cycle of 90°.

14 Claims, 8 Drawing Sheets

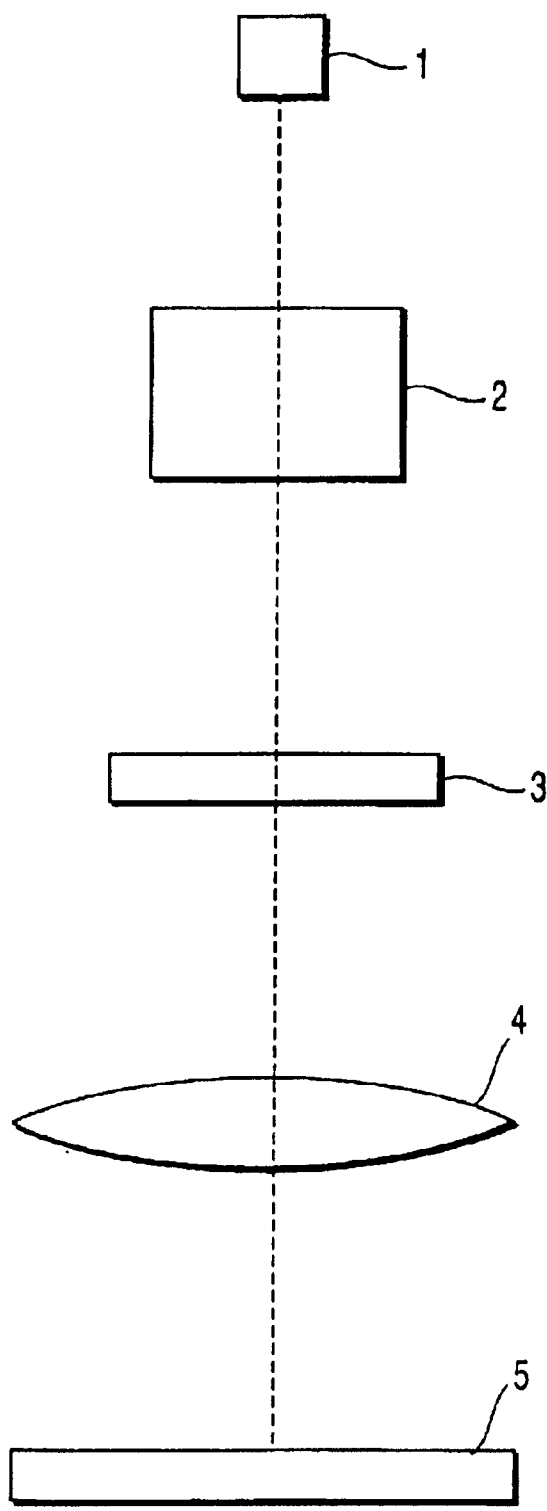
F I G. 1

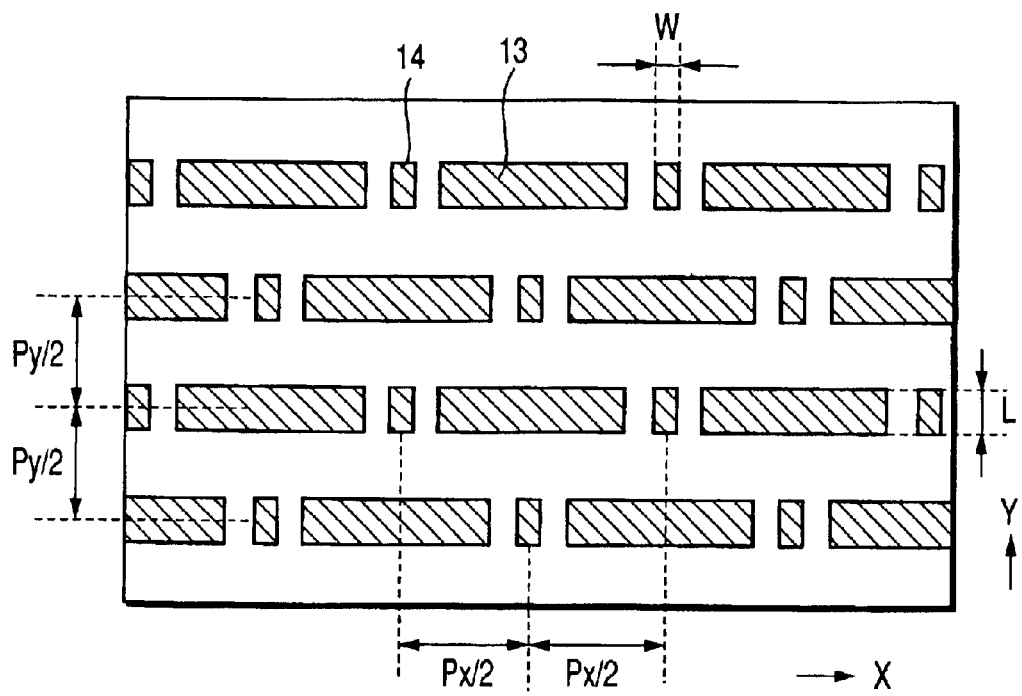
F I G. 7

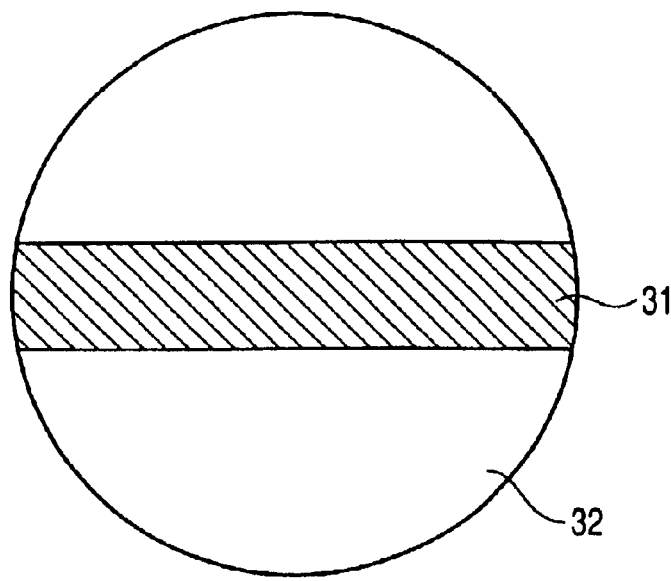
F I G. 10
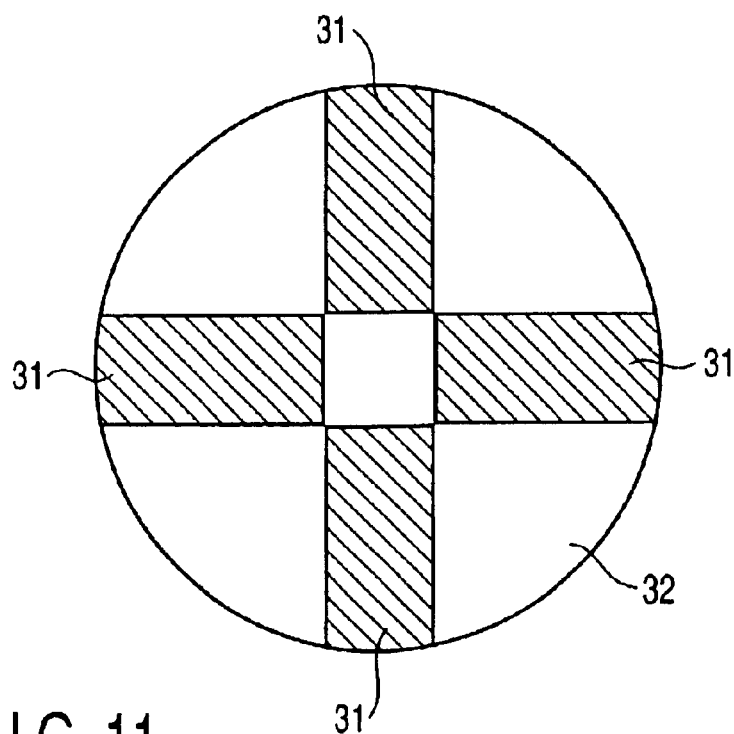
F I G. 11

EXPOSURE METHOD AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2001-195165, filed Jun. 27, 2001, the entire contents of which are incorporated herein by reference.

BACKGROUND OF THE INVENTION

1. Field of the Invention

The present invention relates to an exposure method and a method of manufacturing a semiconductor device and, more particularly, to a technique of reducing the influence of aberration in a lithography process.

2. Description of the Related Art

Recently, with a reduction in the size of a circuit pattern, the influence of aberration of a projection lens in an exposure apparatus poses a problem.

As the aberration of the projection lens decreases, optophysical treatment is required. For this reason, the aberration of an optical system is converted into wave aberration. As a method of expressing wave aberration as a function of pupil coordinate, a method using the Zernike polynomial is widely used. The first to 16th terms of this Zernike polynomial are represented as follows:

Z1: 1
Z2: $r\cos\theta$
Z3: $r\sin\theta$
Z4: $2r^2-1$
Z5: $r^2\cos 2\theta$
Z6: $r^2\sin 2\theta$
Z7: $(3r^2-2r)\cos\theta$
Z8: $(3r^3-2r)\sin\theta$
Z9: $6r^4-6r^2+1$
Z10: $r^3\cos 3\theta$
Z11: $r^3\sin 3\theta$
Z12: $(4r^4-3r^2)\cos 2\theta$
Z13: $(4r^4-3r^2)\sin 2\theta$
Z14: $(10r^5-12r^3+3r)\cos\theta$
Z15: $(10r^5-12r^3+3r)\sin\theta$
Z16: $20r^6-30r^4+12r^2-1$ In this case, Z10 and Z11 are generally called 3θ aberration, which cause an increase in the asymmetry of a pattern and a decrease in DOF (Depth Of Focus). This problem will be described below with reference to FIGS. 12 and 13.

FIG. 12 schematically shows the distribution of Z10 on a pupil plane. The phase advance reaches its peak at 0°, 120°, and 240°, and the phase delay reaches its peak at 60°, 180°, and 300°, with reference to the forward direction of the X-axis.

Consider a case wherein diffraction light is produced in the X-axis direction by a pattern formed on a reticle. In this case, as shown in FIG. 13, zero order light and first order diffraction light on the wafer differ in their imaging positions. For this reason, the light intensity distribution on the wafer becomes asymmetrical. As a consequence, an asymmetrical pattern is projected on the wafer, and no desired pattern can be obtained.

Conventionally, the above problem is solved by adjusting a lens. With regard to 3θ aberration, it is very difficult to perform lens adjustment. It is therefore very difficult to solve the problem that the asymmetrical pattern is projected on a wafer.

When a checkered flag pattern is formed on a reticle, in particular, the influence of 3θ aberration increases owing to the intensity distribution of diffraction light on a pupil plane. For this reason, the problem that the asymmetrical pattern is projected on a wafer becomes more serious.

As described above, with a reduction in the size of a circuit pattern, it becomes more difficult to obtain a desired pattern because of the influence of the aberration of a projection lens. It is especially difficult to reduce the influence of 3θ aberration. Demands have therefore arisen for an exposure method which can project a desired pattern with high precision.

BRIEF SUMMARY OF THE INVENTION

According to the first aspect of the present invention, there is provided an exposure method comprising: preparing an exposure apparatus including an illumination system and a projection lens; setting, in the exposure apparatus, a photomask having a mask pattern including a plurality of unit circuit patterns arranged like a checkered flag pattern and a plurality of unit auxiliary patterns arranged between the unit circuit patterns; and projecting the mask pattern onto a substrate through the projection lens by irradiating the photomask with light from the illumination system, wherein the unit circuit patterns and the unit auxiliary patterns generate a plurality of diffraction light spots on a pupil plane of the projection lens, and the four diffraction light spots having higher light intensities than the remaining diffraction light spots are distributed on the pupil plane in a cycle of 90°.

According to the second aspect of the present invention, there is provided an exposure method comprising: preparing an exposure apparatus including an illumination system having a light shielding area and a projection lens having a plurality of portions where phase shift amounts of aberration distributed in a circumferential direction are maximum; making at least one of the portions correspond to the light shielding area by adjusting a relative angle defined by the illumination system and the projection lens in a circumferential direction of the projection lens; and projecting a mask pattern formed on a photomask onto a substrate through the projection lens by irradiating the photomask with light from the illumination system.

BRIEF DESCRIPTION OF THE SEVERAL VIEWS OF THE DRAWING

FIG. 1 is a view showing the schematic arrangement of an exposure apparatus according to the first and second embodiments of the present invention;

FIG. 7 is a view showing a mask pattern formed on a photomask according to the second embodiment of the present invention;

FIG. 10 is a view showing another light shielding area according to the third embodiment of the present invention;

FIG. 11 is a view showing still another light shielding area according to the third embodiment of the present invention;

DETAILED DESCRIPTION OF THE INVENTION

The embodiments of the present invention will be described below with reference to the views of the accompanying drawing.

First Embodiment

FIG. 1 is a view showing the schematic arrangement of an exposure apparatus according to the first embodiment of the present invention.

This apparatus is basically the same as a general exposure apparatus. After a photomask (reticle) 3 having a desired mask pattern is set in the exposure apparatus, the photomask 3 having the desired mask pattern is irradiated with illumination light from an illumination system including a light source 1 and illumination optical system 2. A pattern image formed by the light that has passed through the photomask (reticle) 3 is projected on a resist on a wafer (semiconductor substrate) 5 through a projection lens (projection optical system) 4. In this case, if the projection optical system includes a plurality of lenses, the projection lens 4 means such a set of lenses, and is assumed to be a lens having optical characteristics equivalent to those obtained by such lenses.

A comparative example of this embodiment will be described with reference to FIGS. 4 and 5.

Figure 4:
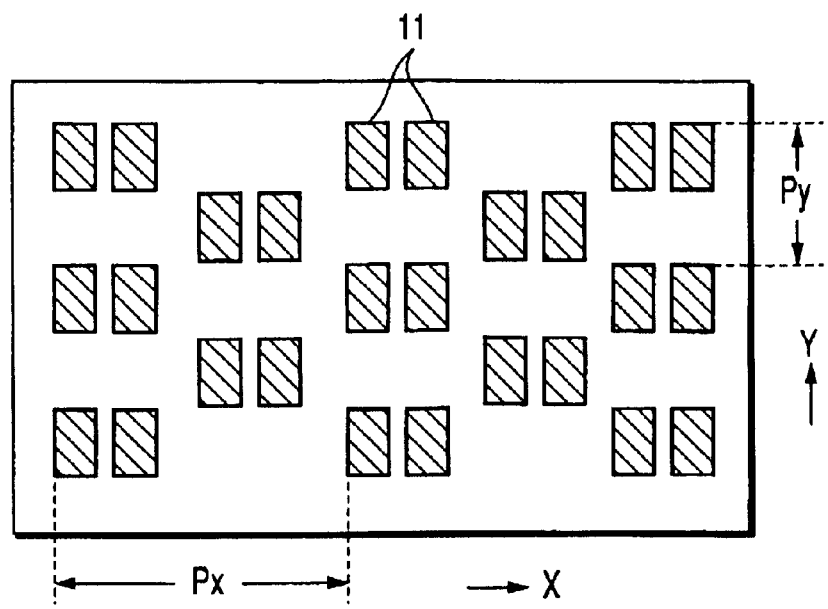
FIG. 4 is a view showing a mask pattern formed on a photomask according to a comparative example of the first embodiment.

FIG. 4 shows the mask pattern formed on the photomask 3. The mask pattern includes a plurality of unit circuit patterns 11 arranged in the checkered flag pattern (checkerboard pattern). The respective unit circuit patterns 11 are arranged in the X and Y directions in predetermined cycles. The cycle in the X direction is represented by Px; and the cycle in the Y direction, Py. The unit circuit pattern 11 is a so-called two-bar pattern which is widely used in semiconductor integrated circuits. Each unit circuit pattern 11 is obtained by arranging two rectangular patterns having identical shapes, which are basically rectangular, in the X direction. In practice, each unit circuit pattern 11 has a complicated polygonal shape that has undergone optical proximity correction. In this case, for the sake of simplicity, FIG. 4 shows the unit circuit patterns that have not undergone optical proximity correction.

Figure 5:
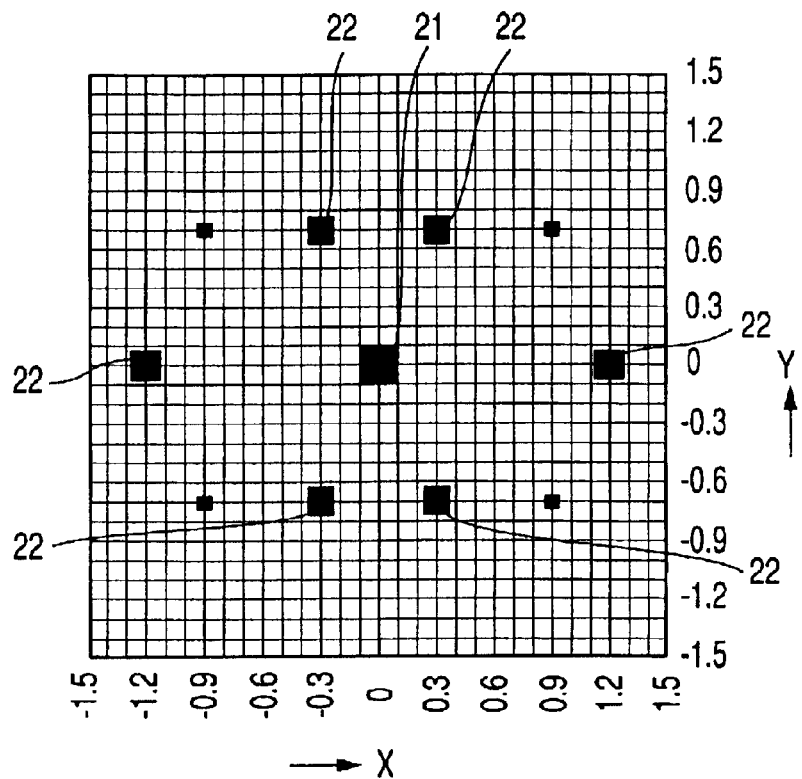
FIG. 5 is a view showing the intensity distribution of diffraction light on a pupil plane of a projection lens which is obtained by the mask pattern shown in FIG. 4 according to the comparative example of the first embodiment.

FIG. 5 shows the intensity distribution of diffraction light on the pupil plane of the projection lens 4, which is obtained by the mask pattern shown in FIG. 4. In this case, for the sake of simplicity, FIG. 5 shows the simulation result obtained by using the light source 1 as a point light source. A spot 21 of zero order light on the pupil plane is set as the origin (0, 0) of the X-Y coordinate system. This coordinate system indicates a relative positional relationship when normalization is done with a numerical aperture NA of the projection lens being set as 1.

As shown in FIG. 5, of diffraction light spots 22, diffraction light spots with relatively strong light intensities are distributed to six positions represented by coordinates (1.2, 0), (−1.2, 0), (0.3, 0.7), (0.3, −0.7), (−0.3, 0.7), and (−0.3, −0.7). If, therefore, a mask pattern like the one shown in FIG. 4 is projected on a wafer, the projected pattern is strongly influenced by 3θ aberration having the peak positions of phase shifts (phase advances and phase delays) distributed in a cycle of 60°. Consequently, the light intensity distribution on the wafer become asymmetrical. As a result, an asymmetrical pattern is projected on the wafer to increase variations in pattern size.

In this embodiment, therefore, unit auxiliary patterns that change the intensity distribution of diffraction light on a pupil plane are added to the unit circuit patterns.

Figure 2:
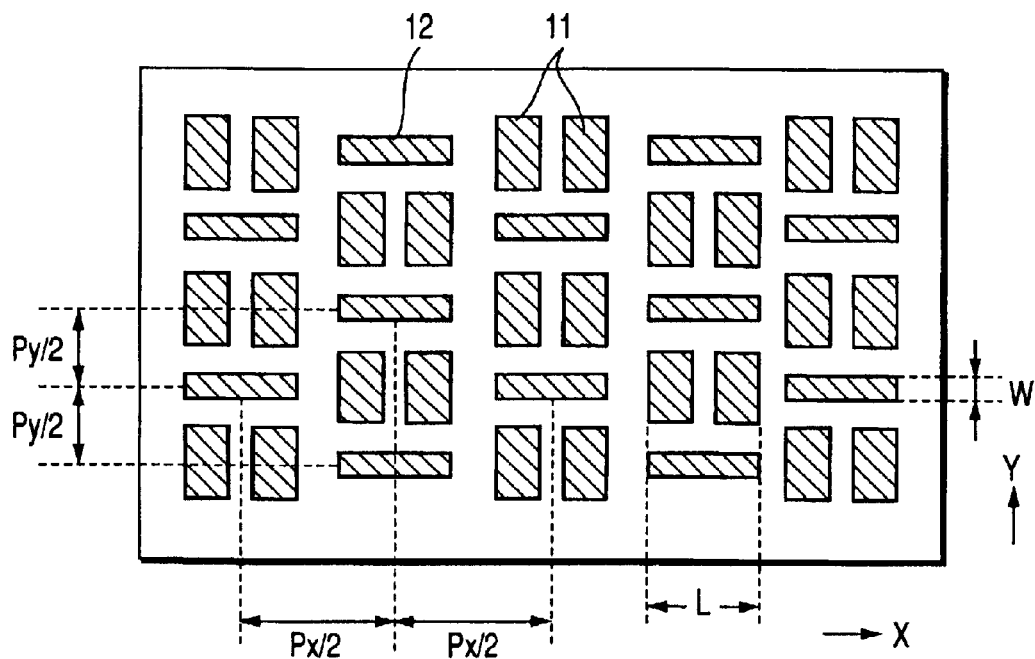
FIG. 2 is a view showing a mask pattern formed on a photomask according to the first embodiment of the present invention.

FIG. 2 shows a mask pattern formed on a photomask 3 in this embodiment. The mask pattern includes a plurality of unit circuit patterns 11 (identical to the patterns in the comparative example shown in FIG. 4) arranged in the checkered flag pattern and unit auxiliary patterns (linear patterns) 12 arranged between the unit circuit patterns 11. As in the comparative example, each unit circuit pattern 11 actually has a complicated polygonal shape having undergone optical proximity correction. In this case, for the sake of simplicity, FIG. 2 shows the patterns that have not undergone optical proximity correction.

Each unit auxiliary pattern 12 has a line width below the resolution limit on a wafer 5. More specifically, a line width W of the unit auxiliary pattern 12 satisfies W≦0.4×λ/NA where λ is the wavelength of illumination light from a light source 1 and NA is the numerical aperture of a projection lens 4. A length L of the unit auxiliary pattern 12 is equal to a length L of the unit circuit pattern 11 in the X direction. In the case shown in FIG. 2, the unit auxiliary pattern 12 is one continuous pattern. However, this pattern may be formed of two separate patterns in correspondence with two rectangular patterns forming the unit circuit pattern 11.

Like the unit circuit patterns 11, the unit auxiliary patterns 12 are arranged in the X and Y directions in predetermined cycles. The cycle in the X direction is represented by Px; and the cycle in the Y direction, Py. The distances between the center of the unit auxiliary pattern 12 and the centers of the two unit circuit patterns 11 located on the two sides of the unit auxiliary pattern 12 are equal to each other. That is, the distance between the centers in the X direction is represented by Px/2; and the distance between the centers in the Y direction, Py/2.

Figure 3:
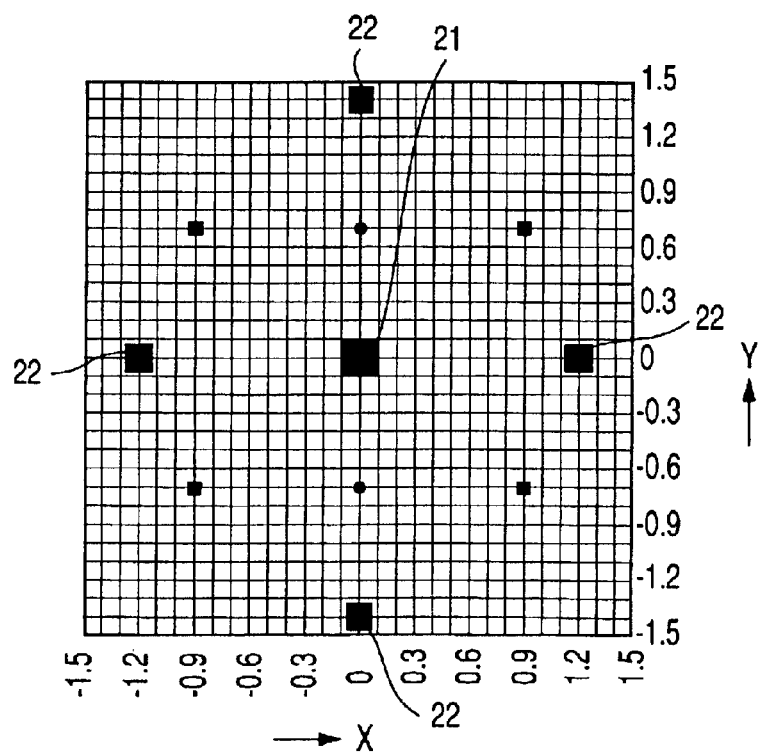
FIG. 3 is a view showing the intensity distribution of diffraction light on a pupil plane of a projection lens which is obtained by the mask pattern shown in FIG. 2 according to the first embodiment of the present invention.

FIG. 3 shows the intensity distribution of diffraction light on the pupil plane of the projection lens 4, which is obtained by the mask pattern shown in FIG. 2. As in the comparative example, FIG. 3 shows the simulation result obtained by using the light source 1 as a point light source. A spot 21 of zero order light on the pupil plane is set as the origin (0, 0) of the X-Y coordinate system.

As shown in FIG. 3, of diffraction light spots 22 formed by diffraction light, diffraction light spots with relatively strong light intensities are distributed to four positions represented by coordinates (1.2, 0), (−1.2, 0), (0, 1.4), and (0, −1.4). That is, these diffraction light spots 22 are distributed in a cycle of 90° in the circumferential direction of the pupil plane. Therefore, the influence of 3θ aberration can be reduced, and the asymmetry of the light intensity distribution on the wafer due to 3θ aberration can be suppressed.

In this embodiment, a two-bar pattern is used as each unit circuit pattern 11. However, a pattern having a larger number of bars may also be used. In addition, the shape, number, length, and the like of unit auxiliary patterns 12 are not limited to those described above. It suffices if the unit auxiliary patterns 12 are arranged such that four light spots, of a plurality of light spots on a pupil plane, which have higher light intensities than the remaining light spots are located on the pupil plane in a cycle of 90°.

As described above, in this embodiment, when the checkered flag pattern is to be projected on a substrate, the intensity distribution of diffraction light on the pupil plane can be corrected by adding unit auxiliary patterns like those described above. As a consequence, the influence of 3θ aberration can be reduced, and variations in pattern size on the substrate can be greatly reduced.

Second Embodiment

The second embodiment of the present invention will be described next. The arrangement of an exposure apparatus is the same as that in the first embodiment shown in FIG. 1.

Figure 6:
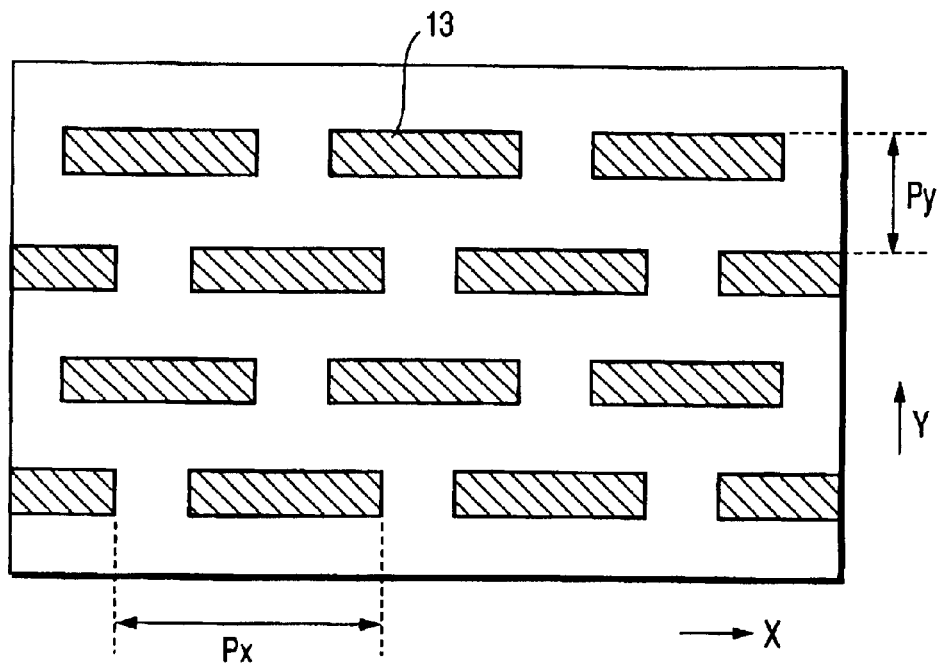
FIG. 6 is a view showing a mask pattern formed on a photomask according to a comparative example of the second embodiment.

FIG. 6 shows a mask pattern formed on a photomask 3 in a comparative example of this embodiment. The mask pattern includes a plurality of unit circuit patterns 13 arranged in the checkered flag pattern. The respective unit circuit patterns 13 are arranged in the X and Y directions in predetermined cycles. The cycle in the X direction is represented by Px; and the cycle in the Y direction, Py. Each unit circuit pattern 13 is a so-called line pattern for wiring, which is widely used in semiconductor integrated circuits, and has a rectangular shape whose longitudinal direction coincides with the X direction.

In practice, each unit circuit pattern 13 has a complicated polygonal shape that has undergone optical proximity correction. As in the first embodiment, for the sake of simplicity, FIG. 6 shows the unit circuit patterns that have not undergone optical proximity correction.

The intensity distribution of diffraction light on the pupil plane of the projection lens 4, which is obtained by the mask pattern shown in FIG. 6, exhibits a similar tendency to that in the comparative example of the first embodiment, which is shown in FIG. 5. Owing to the strong influence of 3θ aberration, therefore, the light intensity distribution on the wafer becomes asymmetrical. As a consequence, an asymmetrical pattern is projected on the wafer, and variations in pattern size increase.

In this embodiment, therefore, auxiliary patterns that change the intensity distribution of diffraction light on a pupil plane are added to the unit circuit patterns.

FIG. 7 shows a mask pattern formed on a photomask 3 in this embodiment. The mask pattern includes a plurality of unit circuit patterns 13 (identical to the patterns in the comparative example shown in FIG. 6) arranged in the checkered flag pattern and unit auxiliary patterns (linear patterns) 14 arranged between the unit circuit patterns 13. As in the comparative example, each unit circuit pattern 13 actually has a complicated polygonal shape having undergone optical proximity correction. In this case, for the sake of simplicity, FIG. 7 shows the patterns that have not undergone optical proximity correction.

Each unit auxiliary pattern 14 has a line width below the resolution limit on a wafer 5. As in the first embodiment, a line width W of the unit auxiliary pattern 14 satisfies $W \leq 0.4 \times \lambda/NA$. A length L of the unit auxiliary pattern 14 is equal to the length L of the unit circuit pattern 13 in the Y direction.

Like the unit circuit patterns 13, the unit auxiliary patterns 14 are arranged in the X and Y directions in predetermined cycles. The cycle in the X direction is represented by Px; and the cycle in the Y direction, Py. The distances between the center of the unit auxiliary pattern 14 and the centers of the two unit circuit patterns 13 located on the two sides of the unit auxiliary pattern 14 are equal to each other. That is, the distance between the centers in the X direction is represented by Px/2; and the distance between the centers in the Y direction, Py/2.

In this embodiment as well, the intensity distribution of diffraction light which is obtained by the mask pattern shown in FIG. 7 exhibits a similar tendency to that in the first embodiment shown in FIG. 3. That is, four diffraction light spots, of the diffraction light spots produced by diffraction light, which have relatively strong light intensities are distributed in a cycle of 90°. As in the first embodiment, therefore, the influence of 3θ aberration can be reduced. As a consequence, the asymmetry of a light intensity distribution on a wafer due to 3θ aberration can be suppressed, and hence variations in pattern size on the wafer can be greatly reduced.

As in the first embodiment, in this embodiment, the shape, number, length, and the like of unit auxiliary patterns 14 are not limited to those described above. It suffices if the unit auxiliary patterns 14 are arranged such that four light spots, of a plurality of light spots on a pupil plane, which have higher light intensities than the remaining light spots are located on the pupil plane in a cycle of 90°.

Third Embodiment

Figure 8:
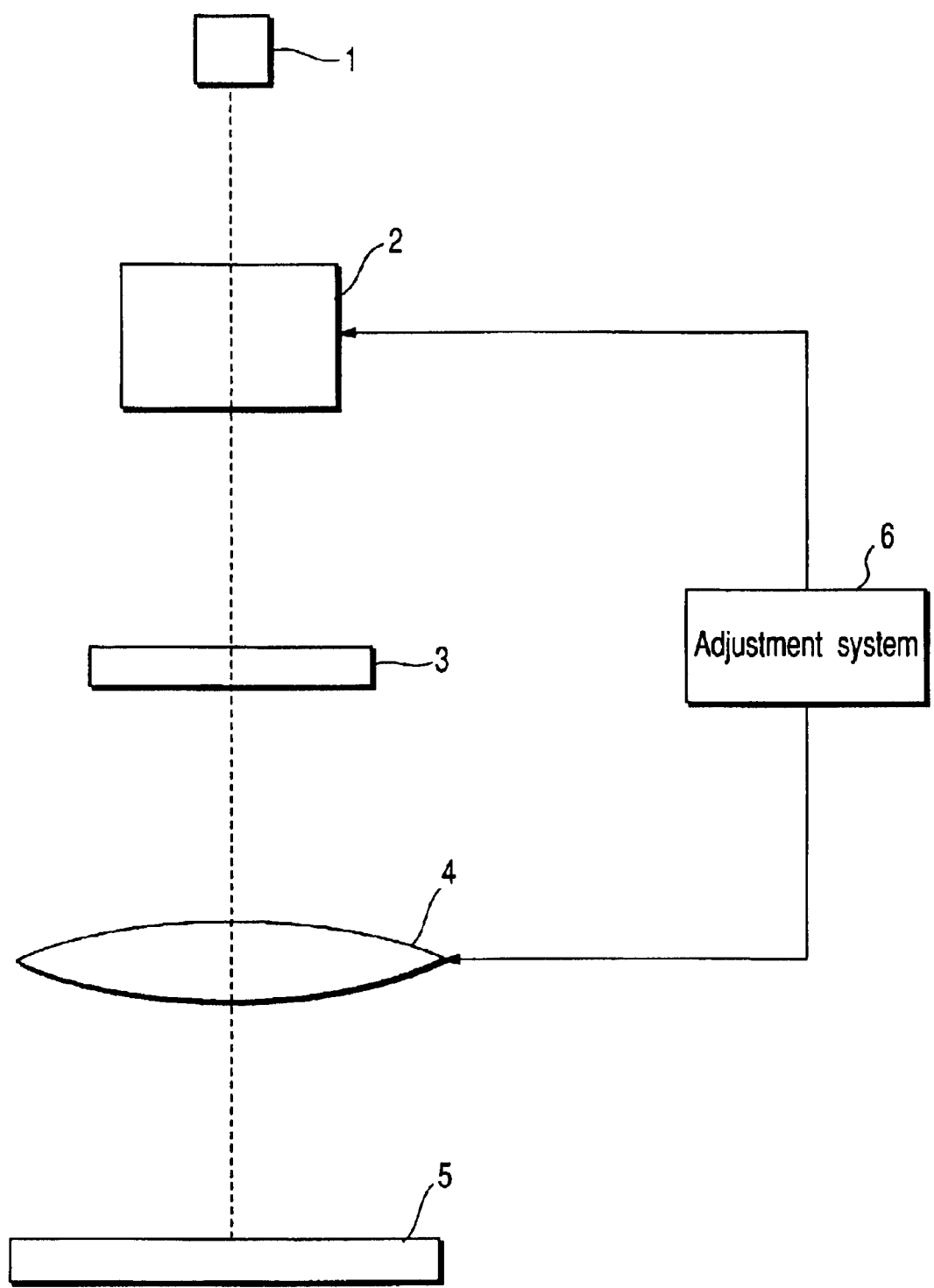
FIG. 8 is a view showing the schematic arrangement of an exposure apparatus according to the third embodiment of the present invention.

FIG. 8 is a view showing the schematic arrangement of an exposure apparatus according to the third embodiment of the present invention.

The basic arrangement of the exposure apparatus shown in FIG. 8 is the same as that of the exposure apparatus shown in FIG. 1. In addition to the constituent elements shown in FIG. 1, the exposure apparatus of this embodiment includes an adjustment system (adjustment mechanism) 6 for adjusting the relative angle defined by an illumination system including a light source 1 and an illumination optical system 2 and a projection lens 4 in the rotational direction (circumferential direction of the projection lens 4). The illumination system has a light shielding area, and hence an illumination shape having the light shielding area can be obtained.

When the pattern shown in FIG. 4 in the first embodiment or the pattern shown in FIG. 6 in the second embodiment is used as a pattern on a photomask 3, the influence of 3θ aberration of the projection lens 4 is strong. As a consequence, the light intensity distribution on the wafer becomes asymmetrical, and large variations in pattern size occur.

Figure 9A:
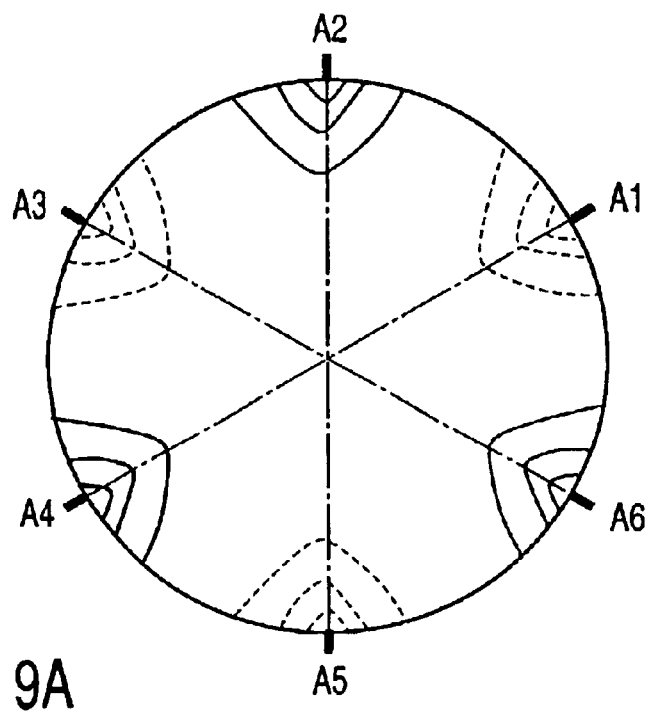
FIGS. 9A and 9B are views showing the relationship between 3θ aberration and the light shielding area of an illumination system according to the third embodiment of the present invention.
Figure 9B:
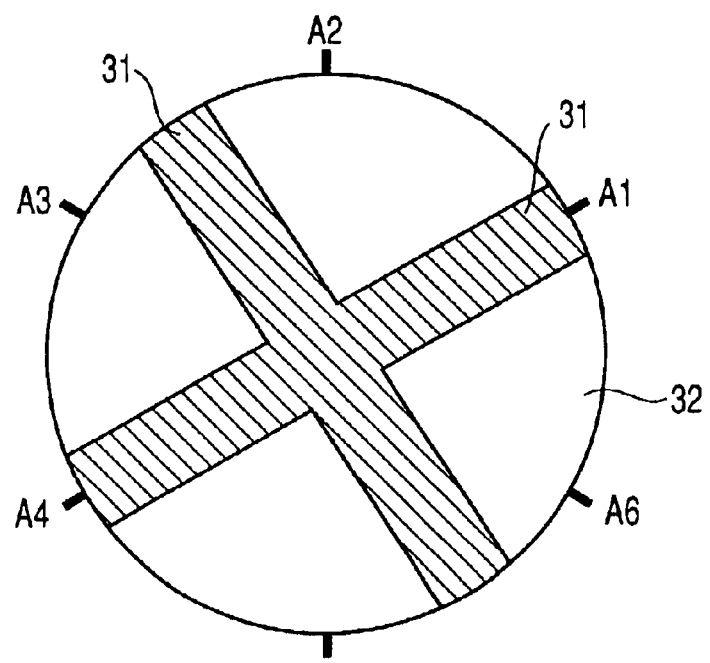
Figure 12:
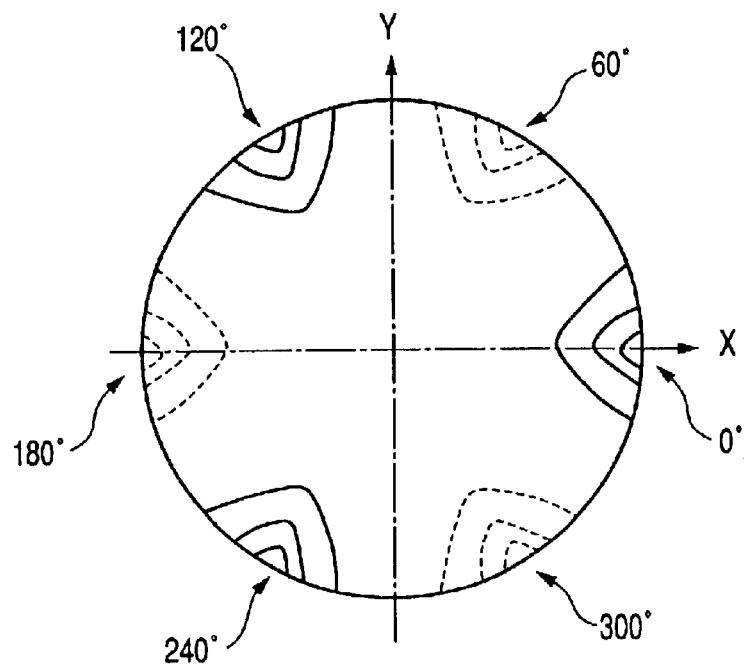
FIG. 12 is a view showing the intensity distribution of 3θ aberration on a pupil plane according to the prior art.
Figure 13:
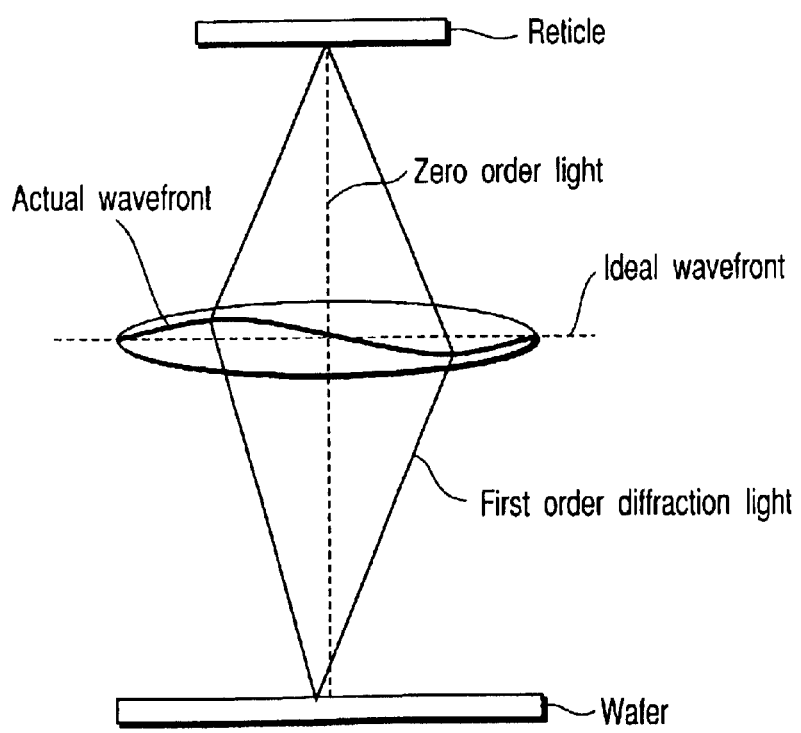
FIG. 13 is a view showing a problem in the prior art.

In this embodiment, therefore, the influence of 3θ aberration is reduced by the technique shown in FIGS. 9A and 9B. As shown in FIG. 9A, peak positions (peak angles) A1 to A6 of phase shifts (phase advances and phase delays) of 3θ aberration are distributed in a cycle of 60°. In this embodiment, as shown in FIG. 9B, the relative angle defined by the illumination system and the projection lens in the rotational direction is adjusted by the adjustment system 6 such that a light shielding area 31 of the illumination system corresponds (overlaps) at least one peak position.

By adjusting the positional relationship between the illumination system and the projection lens in this manner, the influence of 3θ aberration can be suppressed. This makes it possible to correct the asymmetry of the light intensity distribution on the wafer due to 3θ aberration and greatly reduce variations in pattern size on the wafer.

In the above case, a quadruple illumination like the one shown in FIG. 9B is used. However, other various illumination shapes such as the dipole illumination shown in FIG. 10 and the pentameric illumination shown in FIG. 11 can be used. In addition, the light shielding area 31 and an aperture area 32 may take various shapes. In addition to the relative angle defined by the illumination system and the projection lens in the rotating direction, the relative angle defined by the photomask and the illumination system or the photomask and the projection lens in the rotational direction may be adjusted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure method comprising:
   preparing an exposure apparatus including an illumination system and a projection lens;
   setting, in the exposure apparatus, a photomask having a mask pattern including a plurality of unit circuit patterns arranged like a checkered flag pattern and a plurality of unit auxiliary patterns arranged between the unit circuit patterns; and
   projecting the mask pattern onto a substrate through the projection lens by irradiating the photomask with light from the illumination system,
   wherein the unit circuit patterns and the unit auxiliary patterns generate a plurality of diffraction light spots on a pupil plane of the projection lens, and four of the diffraction light spots having higher light intensities than the remaining diffraction light spots are distributed on the pupil plane in a cycle of 90°.

2. A method according to claim 1, wherein the unit auxiliary pattern is a linear pattern.

3. A method according to claim 2, wherein the linear pattern is not resolved on a surface of the substrate.

4. A method according to claim 2, wherein a width W of the linear pattern is expressed by $W \leq 0.4 \times \lambda/NA$ where $\lambda$ is a wavelength of the light from the illumination system and NA is a numerical aperture of the projection lens.

5. A method according to claim 2, wherein a length of the linear pattern is equal to a length of the unit circuit pattern.

6. A method according to claim 1, wherein distances between the unit auxiliary pattern and the unit circuit patterns located on two sides of the unit auxiliary pattern are equal to each other.

7. A method according to claim 1, wherein the unit circuit pattern includes a plurality of identical rectangular patterns, and the rectangular patters are arranged in a direction parallel to a short side of the rectangular pattern.

8. A method according to claim 7, wherein the unit auxiliary pattern is a linear pattern placed parallel to the short side of the rectangular pattern.

9. A method according to claim 1, wherein the unit circuit pattern is a rectangular pattern.

10. A method according to claim 9, wherein the unit auxiliary pattern is a linear pattern placed parallel to a short side of the rectangular pattern.

11. A method of manufacturing a semiconductor device, comprising:
    preparing an exposure apparatus including an illumination system and a projection lens;
    setting, in the exposure apparatus, a photomask having a mask pattern including a plurality of unit circuit patterns arranged like a checkered flag pattern and a plurality of unit auxiliary patterns arranged between the unit circuit patterns; and
    projecting the mask pattern onto a substrate through the projection lens by irradiating the photomask with light from the illumination system,
    wherein the unit circuit patterns and the unit auxiliary patterns generate a plurality of diffraction light spots on a pupil plane of the projection lens, and four of the diffraction light spots having higher light intensities than the remaining diffraction light spots are distributed on the pupil plane in a cycle of 90°.

12. An exposure method comprising:
    preparing an exposure apparatus including an illumination system having a light shielding area and a projection lens having a plurality of portions where phase shift amounts of aberration distributed in a circumferential direction are maximum;
    making at least one of the portions correspond to the light shielding area by adjusting a relative angle defined by the illumination system and the projection lens in a circumferential direction of the projection lens; and
    projecting a mask pattern formed on a photomask onto a substrate through the projection lens by irradiating the photomask with light from the illumination system.

13. A method according to claim 12, wherein the mask pattern includes a plurality of unit circuit patterns arranged like a checkered flag pattern.

14. A method of manufacturing a semiconductor device, comprising:
    preparing an exposure apparatus including an illumination system having a light shielding area and a projection lens having a plurality of portions where phase shift amounts of aberration distributed in a circumferential direction are maximum;
    making at least one of the portions correspond to the light shielding area by adjusting a relative angle defined by the illumination system and the projection lens in a circumferential direction of the projection lens; and
    projecting a mask pattern formed on a photomask onto a substrate through the projection lens by irradiating the photomask with light from the illumination system.

\* \* \* \* \*